(12) United States Patent
Chen et al.

(10) Patent No.: US 11,199,882 B2
(45) Date of Patent: Dec. 14, 2021

(54) DISPLAY DEVICE

(71) Applicant: Wuhan China Star Optoelectronics Semiconductor Display Technology Co., Ltd., Hubei (CN)

(72) Inventors: Min Chen, Hubei (CN); Chaoyu Yuan, Hubei (CN)

(73) Assignee: WUHAN CHINA STAR OPTOELECTRONICS SEMICONDUCTOR DISPLAY TECHNOLOGY CO., LTD., Hubei (CN)

( * ) Notice: Subject to any disclaimer, the term of this patent is extended or adjusted under 35 U.S.C. 154(b) by 261 days.

(21) Appl. No.: 16/319,318

(22) PCT Filed: Jan. 8, 2019

(86) PCT No.: PCT/CN2019/070781
§ 371 (c)(1),
(2) Date: Jan. 18, 2019

(87) PCT Pub. No.: WO2020/118822
PCT Pub. Date: Jun. 18, 2020

(65) Prior Publication Data
US 2021/0004064 A1 Jan. 7, 2021

(30) Foreign Application Priority Data
Dec. 11, 2018 (CN) .......................... 201811510788.5

(51) Int. Cl.
*H05K 1/00* (2006.01)
*G06F 1/18* (2006.01)
*H05K 1/11* (2006.01)

(52) U.S. Cl.
CPC ............. *G06F 1/189* (2013.01); *H05K 1/118* (2013.01)

(58) Field of Classification Search
CPC ...... G06F 1/189; H05K 1/118; H05K 1/0268; H05K 2201/09409; H01L 23/49838; H01L 23/4985; G01R 31/2644
See application file for complete search history.

(56) References Cited

U.S. PATENT DOCUMENTS 6,426,467 B1 * 7/2002 Gyouten ................. H01L 22/32
174/260
8,035,790 B2 * 10/2011 Onodera ................ H05K 3/361
349/152

(Continued)

FOREIGN PATENT DOCUMENTS

CN 104123902 A 10/2014
CN 106449713 A 2/2017

(Continued)

OTHER PUBLICATIONS

CN 106449713 A English Translation published on Feb. 22, 2017 (Year: 2017).*

*Primary Examiner* — Pete T Lee
(74) *Attorney, Agent, or Firm* — Hamre, Schumann, Mueller & Larson, P.C.

(57) ABSTRACT

A display device is provided and includes a display panel and a flexible printed wiring substrate. The display panel is provided with a binding structure. The binding structure includes a plurality of first connection terminals arranged along a width direction of the display panel; and a flexible printed wiring substrate is electrically connected to the bonding structure of the display panel. Each of the first connection terminals is obliquely disposed along a lateral edge of the width direction of the display panel, and adjacent lateral edges of two of the adjacent first connection terminals along the width direction of the display panel are parallel to each other.

18 Claims, 5 Drawing Sheets

(56) References Cited

U.S. PATENT DOCUMENTS

| | | | |
|---|---|---|---|
| 2007/0275578 A1* | 11/2007 | Yamada | H05K 1/0269 439/79 |
| 2015/0103500 A1* | 4/2015 | Bae | H01L 24/06 361/749 |
| 2015/0366049 A1* | 12/2015 | Lee | H01L 27/124 361/749 |
| 2017/0271293 A1 | 9/2017 | Heo et al. | |
| 2018/0014405 A1 | 1/2018 | Kim et al. | |
| 2019/0088584 A1* | 3/2019 | Won | H01L 27/124 |
| 2019/0281699 A1 | 9/2019 | Bae et al. | |

FOREIGN PATENT DOCUMENTS

| | | |
|---|---|---|
| CN | 107193165 A | 9/2017 |
| CN | 107591424 A | 1/2018 |

\* cited by examiner

DISPLAY DEVICE

FIELD OF INVENTION

The present invention relates to a technical field in displays, and particularly to a display device.

BACKGROUND OF DISCLOSURE

In a manufacturing process of an organic light emitting diode (OLED), a bonding process realizes an electrical connection between a panel and a flexible printed wiring substrate (or flexible printed circuit board, FPC) through anisotropic conductive adhesive (anisotropic conductive film, ACF). In the bonding process, terminals on the flexible printed wiring substrate are aligned and connected with terminals on the panel. Wiring designs of the bonding region of the panel directly affect the yield of the bonding.

However, resolution of the display device increases, the terminals of the binding region become denser. A single row design is usually adopted for the terminals in an existing binding region, and space between the terminals is small for high resolution products. In the binding process, it is difficult to precisely align the terminals on the flexible printed wiring board with the terminals on the panel. In the bonding process, the terminals are likely to shift along a width direction of the display device, thereby easily causing the terminals to short circuit, and thereby causing a decrease in the yield of the products.

SUMMARY OF INVENTION

Technical Problems

In a binding process of a display device, terminals tend to shift in a width direction of the display device, thereby easily causing the terminals to short circuit.

Technical Solutions

A display device, comprising:
a display panel provided with a binding structure, wherein the binding structure includes a plurality of first connection terminals arranged along a width direction of the display panel; and
a flexible printed wiring substrate electrically connected to the bonding structure of the display panel;
wherein each of the first connection terminals is obliquely disposed along a lateral edge of the width direction of the display panel, adjacent lateral edges of two of the adjacent first connection terminals along the width direction of the display panel are parallel to each other; the flexible printed wiring substrate is provided with second connection terminals, each of which corresponds to one of the first connection terminals; overall shapes of cross sections of all of the first connection terminals are same; and the flexible printing wiring substrate is a chip-on-film board.

In a further embodiment, the overall shapes of the cross sections of the first connection terminals are a trapezoid.

In a further embodiment, the overall shapes of the cross sections of the first connection terminals are an isosceles trapezoid.

In a further embodiment, the overall shapes of the cross sections of the first connection terminals are a triangle.

In a further embodiment, the overall shapes of the cross sections of the first connection terminals are an isosceles triangle.

In a further embodiment, the overall shapes of the cross sections of the first connection terminals are a parallelogram.

In a further embodiment, the overall shapes of the cross sections of the first connection terminals are an angle bracket shape ">".

In a further embodiment, an angle between a lateral edge and a bottom edge of each of the first connection terminals is less than 85 degrees or greater than 95 degrees.

A display device, comprising:
a display panel provided with a binding structure, wherein the binding structure includes a plurality of first connection terminals arranged along a width direction of the display panel; and
a flexible printed wiring substrate electrically connected to the bonding structure of the display panel;
wherein each of the first connection terminals is obliquely disposed along a lateral edge of the width direction of the display panel, adjacent lateral edges of two of the adjacent first connection terminals along the width direction of the display panel are parallel to each other; and the flexible printed wiring substrate is provided with second connection terminals, each of which corresponds to one of the first connection terminals.

In a further embodiment, overall shapes of cross sections of all of the first connection terminals are same.

In a further embodiment, the overall shapes of the cross sections of the first connection terminals are a trapezoid.

In a further embodiment, the overall shapes of the cross sections of the first connection terminals are an isosceles trapezoid.

In a further embodiment, the overall shapes of the cross sections of the first connection terminals are a triangle.

In a further embodiment, the overall shapes of the cross sections of the first connection terminals are an isosceles triangle.

In a further embodiment, the overall shapes of the cross sections of the first connection terminals are a parallelogram.

In a further embodiment, the overall shapes of the cross sections of the first connection terminals are an angle bracket shape ">".

In a further embodiment, an angle between a lateral edge and a bottom edge of each of the first connection terminals is less than 85 degrees or greater than 95 degrees.

In a further embodiment, the flexible printing wiring substrate is a chip-on-film board.

Beneficial Effects

By obliquely disposing the lateral edges of the first connection terminals and the second connection terminals and making the adjacent lateral edges of two of the adjacent first connection terminals parallel to each other, a valid safety shift of the second connection terminals is increased under the implementation of the same resolution, thereby preventing the second connection terminals from turning on the first connection terminals and causing the terminal to short circuit, and thereby improving the yield of the bonding.

BRIEF DESCRIPTION OF DRAWINGS

In order to more clearly illustrate the embodiments of the present invention or the technical solutions in prior arts, the following briefly introduces the accompanying drawings used in the embodiments. Obviously, the drawings in the following description merely show some of the embodiments of the present invention. As regards one of ordinary skill in the art, other drawings can be obtained in accordance with these accompanying drawings without making creative efforts.

REFERENCE NUMBERS

Figure 1:
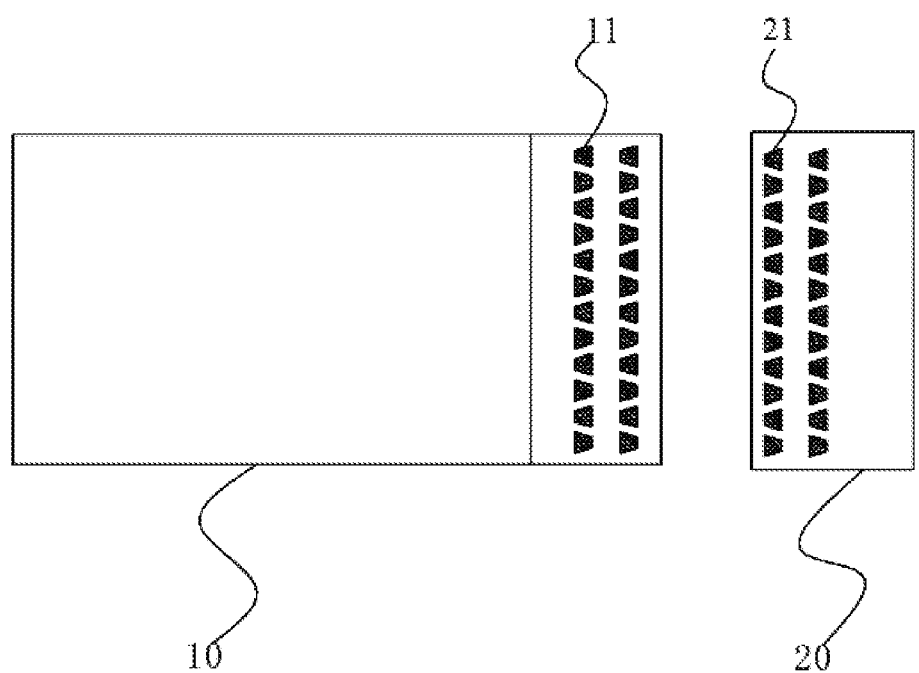
FIG. 1 is a schematic view of a display device in accordance with an embodiment of the present disclosure.

10: display panel
11: first connection terminals
20: flexible printed wiring substrate
21: second connection terminal

DETAILED DESCRIPTION OF PREFERRED EMBODIMENTS

The following description of the embodiments with reference to the accompanying drawings is used to illustrate particular embodiments of the present disclosure. The directional terms referred in the present disclosure, such as "upper", "lower", "front", "back", "left", "right", "inner", "outer", "side surface", etc. are only directions with regard to the accompanying drawings. Therefore, the directional terms used for describing and illustrating the present disclosure are not intended to limit the present disclosure. In the drawings, units with similar structures are indicated by the same reference number.

The present disclosure aims at a technical problem that in a binding process of an existing display device, terminals tend to shift along a width direction of the display device, thereby easily causing the terminals to short circuit and decreasing the yield of the products. The present disclosure resolves the aforementioned problem.

First Embodiment

Figure 2:
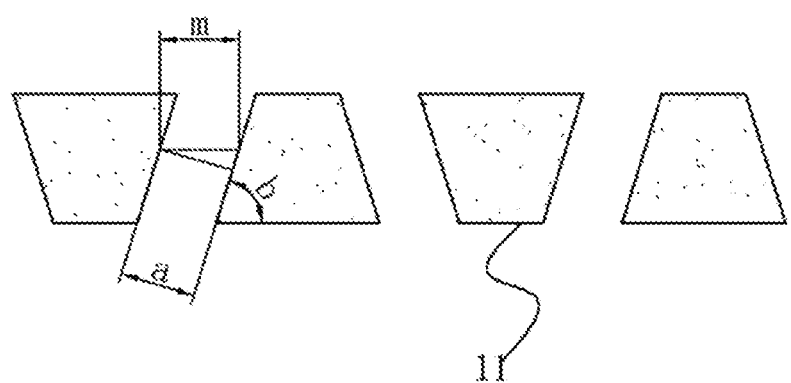
FIG. 2 is a schematic structural view of a first connection terminal in accordance with a first embodiment of the present invention.

A display device, as shown in FIG. 1 and FIG. 2, includes a display panel 10 and a flexible printed wiring substrate 20. The flexible printed wiring substrate 20 is a chip-on-film board.

The display panel 10 is provided with a terminal region, and the terminal region is provided with a binding structure. The binding structure includes a plurality of first connection terminals 11 arranged along a width direction of the display panel 10. The flexible printed wiring substrate 20 is electrically connected to the bonding structure of the display panel 10.

Each of the first connection terminals 11 is obliquely disposed along a lateral edge of the width direction of the display panel 10, and adjacent lateral edges of two of the adjacent first connection terminals 11 along the width direction of the display panel 10 are parallel to each other. The flexible printed wiring substrate 20 is provided with second connection terminals 21, each of which corresponds to one of the first connection terminals 11. The second connection terminals 21 are bound to and electrically connected to the first connection terminal 11 by an anisotropic conductive adhesive.

By obliquely disposing the lateral edges of the first connection terminals 11, a valid safety shift of the second connection terminals 21 is increased under the implementation of the same resolution, thereby preventing the second connection terminals 21 from turning on the first connection terminals 11 and causing the terminals to short circuit, and thereby improving the yield of the bonding.

It should be noted that, as shown in FIG. 2, a vertical distance between the adjacent lateral edges of two of the adjacent first connection terminals 11 is a. A valid safety shift of the second connection terminals 21 along the width direction of the display panel 10 is m. An angle between a lateral edge and a bottom edge of each of the first connection terminals 11 is b.

When the angle between the lateral edge and the bottom edge of the first connection terminal 11 is an acute angle, m is a quotient of a and sin b. That is, $m=a/\sin b$. When the angle between the lateral edge and the bottom edge of the first connection terminal is an obtuse angle, $m=a/\sin(180-b)$. In both cases, the m value is greater than the a value. Moreover, in the case where the a value is not changed, e.g. under the implementation of the same resolution, the smaller the b value is, the greater the valid safety shift m of the second connection terminals 21 along the width direction of the display panel 10 is, and the smaller the risk of short circuit occurring to the first connection terminals 11 in the bonding process is, thereby improving the yield of the binding.

Specifically, when the angle between the lateral edge and the bottom edge of the first connecting terminal 11 is an acute angle, b is less than 85 degrees, and when the angle between the lateral edge and the bottom edge of the first connecting terminal 11 is an obtuse angle, b is greater than 95 degrees. In an embodiment, the angle between the lateral edge and the bottom edge of the first connection terminal 11 is 45 degrees or 135 degrees.

It should be noted that, in order to further enhance the connection strength of the flexible printed wiring substrate 20 and the display panel 10 and assist the improvement of the high resolution of the display panel 10, in an embodiment, the first connection terminals 11 are evenly arranged, and the first connection terminals 11 are distributed in at least two rows and two columns.

Furthermore, space between the adjacent two rows of the first connecting terminals 11 is greater than space between a top edge and a bottom edge of a first connection terminal 11, thereby preventing the second connection terminals 21 from shifting in a longitudinal direction of the display panel 10 in the binding process, and thereby causing the first connection terminals 11 to short circuit.

Specifically, overall shapes of cross sections of all of the first connection terminals 11 are the same, and overall shapes of cross sections of the second connection terminals 21 are the same as the overall shapes of the cross sections of the first connection terminals 11.

The first connection terminals 11 and the second connection terminals 21 are evenly distributed and are in the same shape, thereby improving precision during a manufacturing process, and facilitating an alignment connection of the second connection terminals 21 and the first connection terminals 11.

As shown in FIG. 2, specifically, the overall shapes of the cross sections of the first connection terminals 11 are trapezoidal.

Furthermore, the overall shapes of the cross sections of the first connection terminals 11 are an isosceles trapezoid.

Second Embodiment

Figure 3:
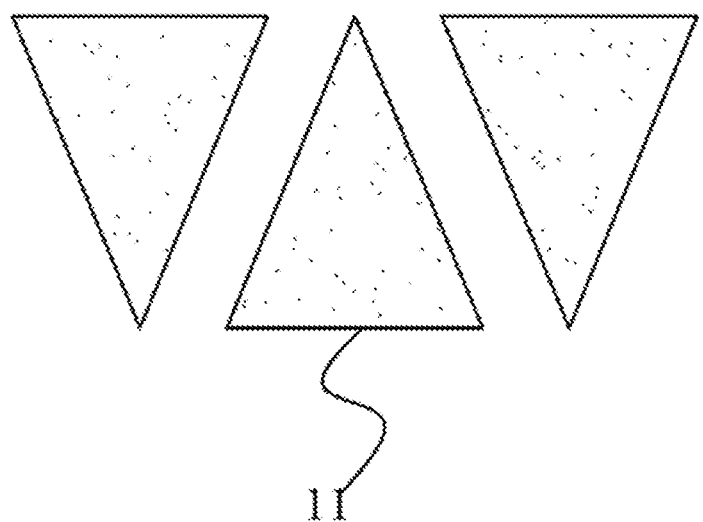
FIG. 3 is a schematic structural view of a first connection terminal in accordance with a second embodiment of the present invention.

A display device, as shown in FIG. 3, differs from the first embodiment only in that the overall shapes of the cross sections of the first connection terminals 11 are different.

Specifically, the overall shapes of the cross sections of the first connection terminals 11 are triangles.

Furthermore, the overall shapes of the cross sections of the first connection terminals 11 are isosceles triangles.

It should be noted that, in a specific implementation, the overall shapes of the cross sections of the first connection terminals 11 may also be equilateral triangles.

Third Embodiment

Figure 4:
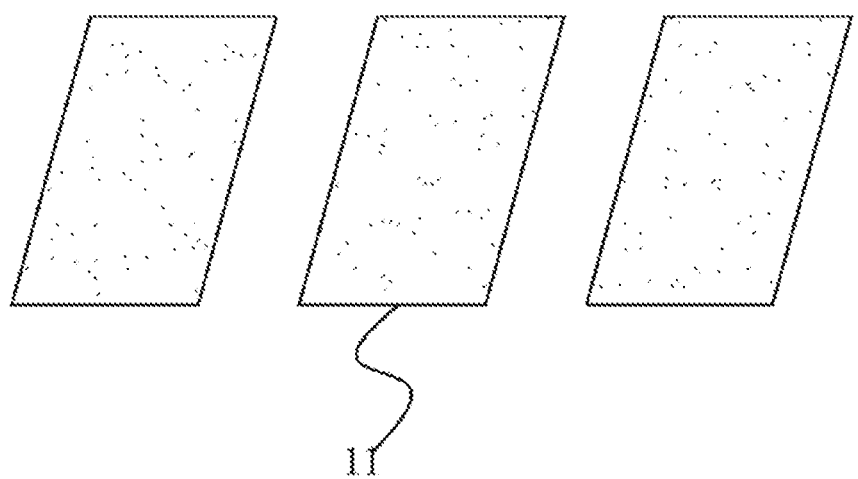
FIG. 4 is a schematic structural view of a first connection terminal in accordance with a third embodiment of the present invention.

A display device, as shown in FIG. 4, differs from the first embodiment only in that the overall shapes of the cross sections of the first connection terminals 11 are different.

Specifically, the overall shapes of the cross sections of the first connection terminals 11 are parallelograms.

It should be noted that, in a specific implementation, the overall shape of the cross sections of the first connection terminals 11 may also be a diamond shape.

Fourth Embodiment

Figure 5:
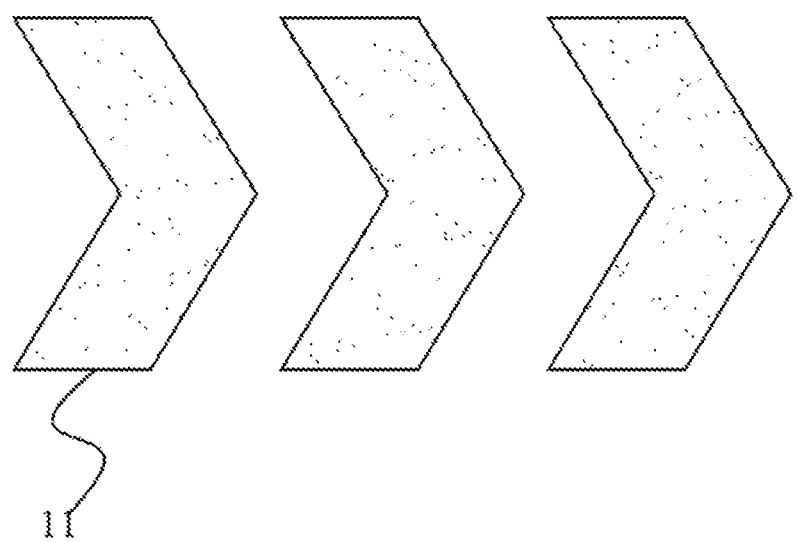
FIG. 5 is a schematic structural view of a first connection terminal in accordance with a fourth embodiment of the present invention.

A display device, as shown in FIG. 5, differs from the first embodiment only in that the overall shapes of the cross section of the first connection terminals 11 are different.

Specifically, the overall shapes of the cross sections of the first connection terminals 11 are angle bracket shapes ">".

Beneficial Effects are as follows: By obliquely disposing the lateral edges of the first connection terminals 11 and the second connection terminals 21 and making the adjacent lateral edges of two of the adjacent first connection terminals 11 parallel to each other, a valid safety shift of the second connection terminals 21 is increased under the implementation of the same resolution, thereby preventing the second connection terminals 21 from turning on the first connection terminals 11 and causing the terminals to short circuit, and thereby improving the yield of the bonding.

In summary, although the preferable embodiments of the present disclosure have been disclosed above, the embodiments are not intended to limit the present disclosure. A person of ordinary skill in the art, without departing from the spirit and scope of the present disclosure, can make various modifications and variations. Therefore, the scope of the disclosure is defined in the claims.

What is claimed is:

1. A display device, comprising:
a display panel provided with a binding structure, wherein the binding structure includes a plurality of first connection terminals arranged along a width direction of the display panel; and a flexible printed wiring substrate electrically connected to a bonding structure of the display panel;
wherein each of the first connection terminals is obliquely disposed along a lateral edge of the width direction of the display panel, adjacent lateral edges of two of the adjacent first connection terminals along the width direction of the display panel are parallel to each other; the flexible printed wiring substrate is provided with second connection terminals, each of which corresponds to one of the first connection terminals; each of the second connection terminals is obliquely disposed along a lateral edge of the width direction of the display panel, adjacent lateral edges of two of the adjacent second connection terminals along the width direction of the display panel are parallel to each other; overall shapes of cross sections of all of the first connection terminals are same; and the flexible printing wiring substrate is a chip-on-film board.

2. The display device as claimed in claim 1, wherein the overall shapes of the cross sections of the first connection terminals are trapezoids.

3. The display device as claimed in claim 2, wherein the overall shapes of the cross sections of the first connection terminals are isosceles trapezoids.

4. The display device as claimed in claim 1, wherein the overall shapes of the cross sections of the first connection terminals are triangles.

5. The display device as claimed in claim 4, wherein the overall shapes of the cross sections of the first connection terminals are isosceles triangles.

6. The display device as claimed in claim 1, wherein the overall shapes of the cross sections of the first connection terminals are parallelograms.

7. The display device as claimed in claim 1, wherein the overall shapes of the cross sections of the first connection terminals are angle bracket shapes ">".

8. The display device as claimed in claim 1, wherein an angle between a lateral edge and a bottom edge of each of the first connection terminals is less than 85 degrees or greater than 95 degrees.

9. A display device, comprising:
a display panel provided with a binding structure, wherein the binding structure includes a plurality of first connection terminals arranged along a width direction of the display panel; and
a flexible printed wiring substrate electrically connected to a bonding structure of the display panel;
wherein each of the first connection terminals is obliquely disposed along a lateral edge of the width direction of the display panel, adjacent lateral edges of two of the adjacent first connection terminals along the width direction of the display panel are parallel to each other; and the flexible printed wiring substrate is provided with second connection terminals, each of which corresponds to one of the first connection terminals; each of the second connection terminals is obliquely disposed along a lateral edge of the width direction of the display panel, adjacent lateral edges of two of the adjacent second connection terminals along the width direction of the display panel are parallel to each other.

10. The display device as claimed in claim 9, wherein overall shapes of cross sections of all of the first connection terminals are same.

11. The display device as claimed in claim 10, wherein the overall shapes of the cross sections of the first connection terminals are trapezoids.

12. The display device as claimed in claim 11, wherein the overall shapes of the cross sections of the first connection terminals are isosceles trapezoids.

13. The display device as claimed in claim 10, wherein the overall shapes of the cross sections of the first connection terminals are triangles.

14. The display device as claimed in claim 13, wherein the overall shapes of the cross sections of the first connection terminals are isosceles triangles.

15. The display device as claimed in claim 10, wherein the overall shapes of the cross sections of the first connection terminals are parallelograms.

16. The display device as claimed in claim 10, wherein the overall shapes of the cross sections of the first connection terminals are angle bracket shapes ">".

17. The display device as claimed in claim 10, wherein an angle between a lateral edge and a bottom edge of each of the first connection terminals is less than 85 degrees or greater than 95 degrees.

18. The display device as claimed in claim 9, wherein the flexible printing wiring substrate is a chip-on-film board.

\* \* \* \* \*